United States Patent
Eom

(12) 
(10) Patent No.: US 9,490,198 B1
(45) Date of Patent: Nov. 8, 2016

(54) TRANSMITTING AND RECEIVING PACKAGE

(71) Applicant: ELECTRONICS AND TELECOMMUNICATIONS RESEARCH INSTITUTE, Daejeon (KR)

(72) Inventor: Yong Sung Eom, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/958,927

(22) Filed: Dec. 3, 2015

(30) Foreign Application Priority Data

Aug. 17, 2015 (KR) .................. 10-2015-0115531

(51) Int. Cl.
  *H01L 23/52* (2006.01)
  *H01L 23/498* (2006.01)
  *H01L 23/367* (2006.01)
  *H01L 25/16* (2006.01)

(52) U.S. Cl.
  CPC ....... *H01L 23/49827* (2013.01); *H01L 23/367* (2013.01); *H01L 23/49811* (2013.01); *H01L 23/49866* (2013.01); *H01L 25/16* (2013.01)

(58) Field of Classification Search
  CPC .................. H01L 23/49827; H01L 23/49811; H01L 25/16; H01L 23/367; H01L 23/49866
  USPC ......................................................... 257/774
  See application file for complete search history.

(56) References Cited

U.S. PATENT DOCUMENTS

| | | | |
|---|---|---|---|
| 9,129,929 B2 * | 9/2015 | Lundberg | H01L 23/34 |
| 2012/0154072 A1 | 6/2012 | Bae et al. | |
| 2013/0087884 A1 | 4/2013 | Bae et al. | |
| 2015/0364445 A1 * | 12/2015 | Choi | H01L 25/0652 257/664 |

FOREIGN PATENT DOCUMENTS

KR 2009-0058874 A 6/2009

OTHER PUBLICATIONS

K. Sakuma et al., "Characterization of Stacked Die using Die-to-Wafer Integration for High Yield and Throughput", 2008 Electronic Components and Technology Conference, pp. 18-23, 2008.

* cited by examiner

*Primary Examiner* — Luan C Thai
(74) *Attorney, Agent, or Firm* — Rabin & Berdo, P.C.

(57) ABSTRACT

Provided is a transmitter and receiver package including an interposer substrate including a top surface, a bottom surface facing the top surface, and a through-via, semiconductor devices mounted on the top surface of the interposer substrate, an exothermic element mounted on the bottom surface of the interposer substrate, and a heat dissipation member disposed on the bottom surface of the interposer substrate, the heat dissipation member being configured to cover the exothermic element.

13 Claims, 8 Drawing Sheets

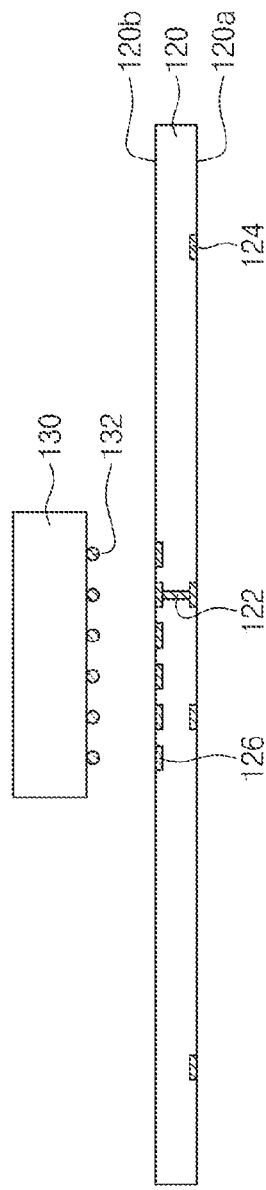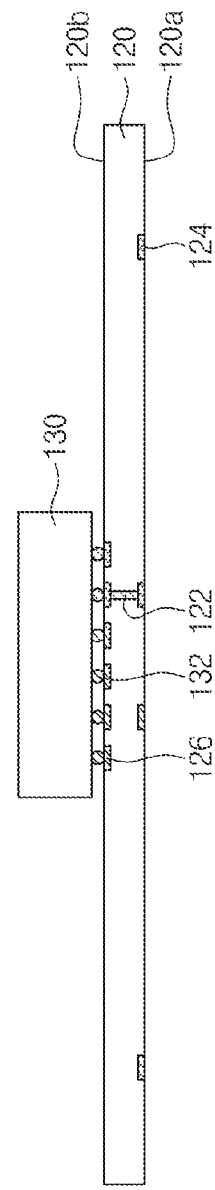

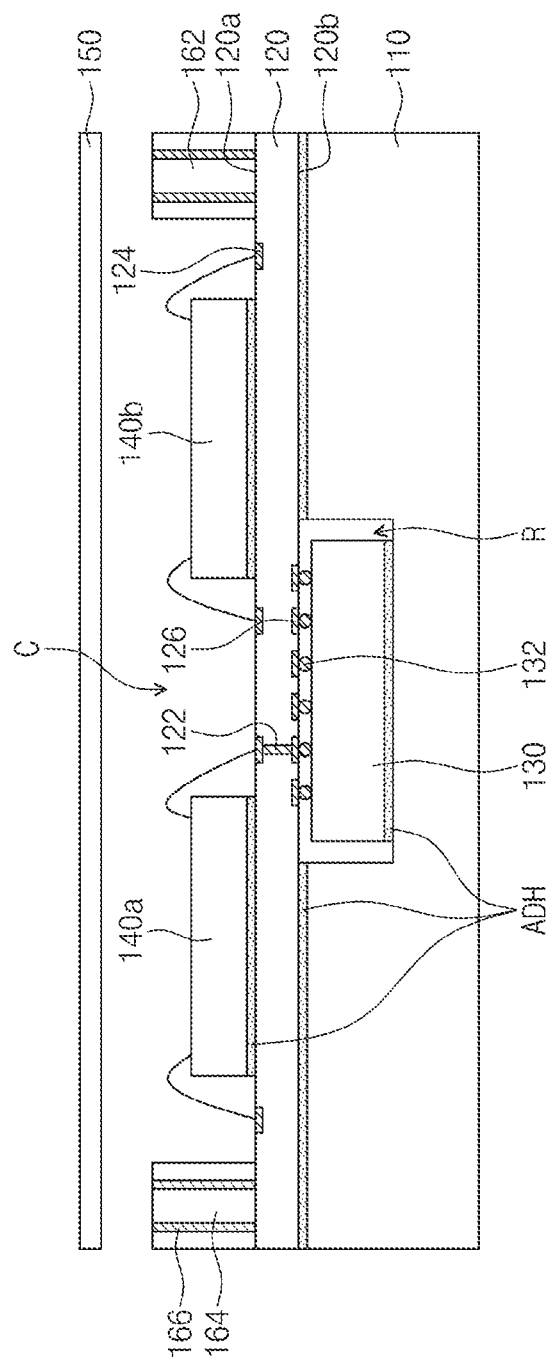

TRANSMITTING AND RECEIVING PACKAGE

CROSS-REFERENCE TO RELATED APPLICATIONS

This U.S. non-provisional patent application claims priority under 35 U.S.C. §119 of Korean Patent Application No. 10-2015-0115531, filed on Aug. 17, 2015, the entire contents of which are hereby incorporated by reference.

BACKGROUND

The present disclosure herein relates to a transmitter and receiver package, and more particularly, to a packaging of a transmitter and receiver package.

In general, a transmitter/receiver package using a semiconductor has been manufactured in a 3-dimensional stacking method using an interposer substrate for downsizing. A transmitter used for the transmitter/receiver package includes an exothermic element, which generates high temperature heat while operating, such as a signal amplifier. The exothermic element is in contact with a heat dissipation member for easy cooling, and the interposer substrate for transmission is used to electrically connect the exothermic element to the heat dissipation member. An interposer substrate for reception is disposed on the interposer substrate for transmission and the exothermic element, a space for mounting and bonding the exothermic element is provided between the interposer substrate for transmission and the interposer substrate for reception, and a connection member for electrically connecting the two interposer substrates to each other is disposed in the space. However, in the transmitter/receiver package of the stacking method, each of the interposer substrates on which devices are mounted is vertically disposed to decrease space efficiency. Thus, the transmitter/receiver package has a difficulty using in a restricted system.

Also, the connection members having the through-vias between interposer substrates are disposed to electrically connect the interposer substrates to each other, and provide the space, in which the devices are mounted, on the interposer substrate. For this, the connection members that are respectively flip-chip bonded to the interposer substrates need to be accurately arranged to be aligned to electrodes of the interposer substrates. Also, since a plurality of connection members are used, the transmitter/receiver may be vulnerable to mechanical deformation caused by vibration and shock.

SUMMARY

The present disclosure provides a transmitter/receiver package having a structure simplified by using single interposer substrate.

The present disclosure also provides a transmitter/receiver package manufacturing process that is simplified by using single interposer substrate.

The object of the present disclosure is not limited to the aforesaid, but other objects not described herein will be clearly understood by those skilled in the art from descriptions below.

An embodiment of the inventive concept provides a transmitter and receiver package including: an interposer substrate including a top surface, a bottom surface facing the top surface, and through-vias; semiconductor devices mounted on the top surface of the interposer substrate; an exothermic element mounted on the bottom surface of the interposer substrate; and a heat dissipation member disposed on the bottom surface of the interposer substrate, the heat dissipation member being configured to cover the exothermic element.

In an embodiment, the semiconductor devices may include a transmitter and a receiver, which are disposed to be spaced apart from each other;

In an embodiment, the transmitter and the exothermic element may be electrically connected to each other through the interposer substrate.

In an embodiment, the exothermic element may be mounted on the bottom surface of the interposer substrate in a flip chip manner.

In an embodiment, the exothermic element may be electrically connected to the transmitter through the through-vias.

In an embodiment, the exothermic element may be in contact with the heat dissipation member to conduct generated heat to the heat dissipation member.

In an embodiment, the interposer substrate, the exothermic element, and the heat dissipation member may be attached to each other by using a thermal conductive adhesive provided therebetween.

In an embodiment, the exothermic element may include a signal amplifier.

In an embodiment, the transmitter and the receiver may be mounted on the top surface of the interposer substrate in a wire bonding manner.

In an embodiment, the semiconductor devices may further include a transmitting and receiving separator for separating a transmission signal from a reception signal.

In an embodiment, the through-vias of the interposer substrate may include through-silicon vias (TSVs) or through-glass vias (TGVs).

In an embodiment, the transmitting and receiving package may further include: a ground substrate disposed on the interposer substrate; and spacers configured to provide cavities, in which the semiconductor devices are respectively disposed, between the interposer substrate and the ground substrate.

In an embodiment, the spacers may include: a first spacer disposed on one side of the interposer substrate; and a second spacer disposed on the other side facing the one side.

In an embodiment, the spacers may include the through-vias

In an embodiment, the ground substrate may be electrically connected to the interposer substrate through the through-vias of the spacers.

In an embodiment, the ground substrate may be used as an antenna.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 4A to 4G are cross-sectional views for explaining the method for manufacturing the transmitter/receiver package according to an embodiment of the inventive concept.

DETAILED DESCRIPTION

Figure 1:
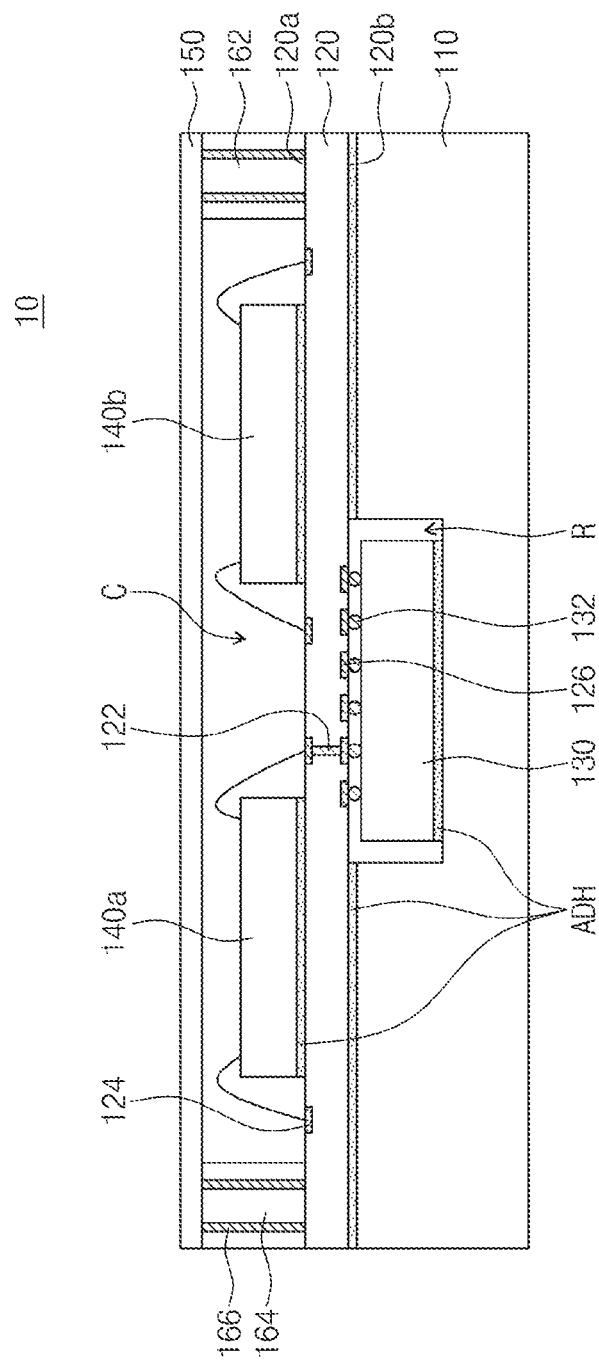
FIG. 1 is a cross-sectional view for explaining a transmitter/receiver package according to an embodiment of the inventive concept.

Exemplary embodiments of the present disclosure will be described with reference to the accompanying drawings so as to sufficiently understand constitutions and effects of the present disclosure. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims. A person with ordinary skill in the technical field of the present disclosure pertains will be understood that the present disclosure can be carried out under any appropriate environments. Like reference numerals refer to like elements throughout.

In the following description, the technical terms are used only for explaining a specific exemplary embodiment while not limiting the present disclosure. The terms of a singular form may include plural forms unless referred to the contrary. The meaning of 'comprises' and/or 'comprising' specifies a component, a step, an operation and/or an element does not exclude other components, steps, operations and/or elements.

Additionally, the embodiment in the detailed description will be described with sectional views as ideal exemplary views of the present disclosure. In the figures, the dimensions of layers and regions are exaggerated for clarity of illustration. Accordingly, shapes of the exemplary views may be modified according to manufacturing techniques and/or allowable errors. Therefore, the embodiments of the present disclosure are not limited to the specific shape illustrated in the exemplary views, but may include other shapes that may be created according to manufacturing processes. For example, an etched region having a right angle illustrated in the drawings may have a round shape or a shape having a predetermined curvature. Thus, this should not be construed as limited to the scope of the present disclosure.

Unless terms used in embodiments of the present disclosure are differently defined, the terms may be construed as meanings that are commonly known to a person skilled in the art.

Hereinafter, the present disclosure will be described in detail by explaining preferred embodiments of the disclosure with reference to the attached drawings.

(Transmitting and Receiving Package)

Figure 2:
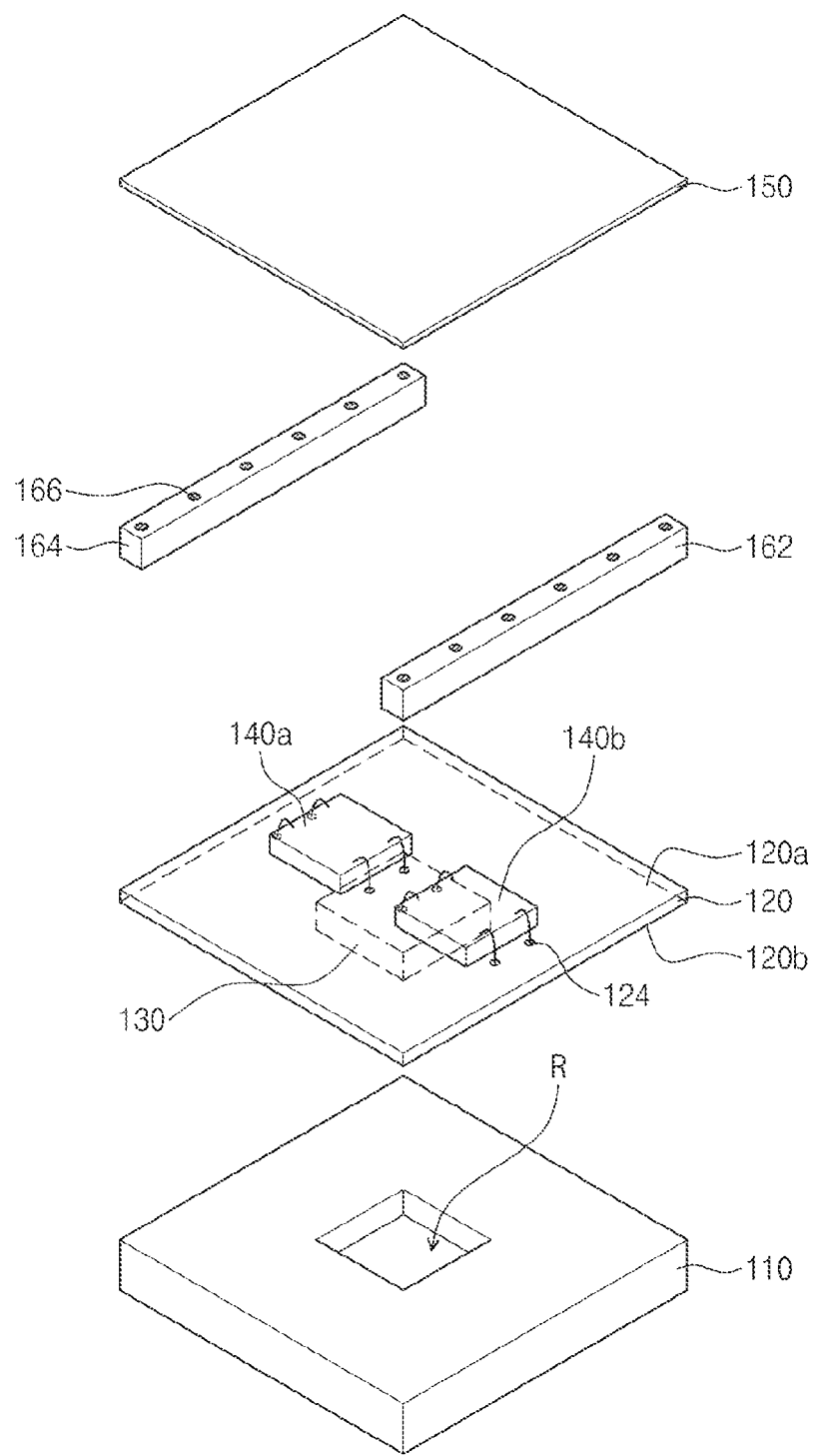
FIG. 2 is an exploded perspective view for explaining the transmitter/receiver package according to an embodiment of the inventive concept.

FIG. 1 is a cross-sectional view for explaining a transmitter and receiver package 10 according to an embodiment of the inventive concept. FIG. 2 is an exploded perspective view for explaining the transmitter and receiver package 10 according to an embodiment of the inventive concept.

Referring to FIGS. 1 and 2, an interposer substrate 120 may be provided. The interposer substrate 120 may include a top surface 120a and a bottom surface 120b opposed to the top surface 120a. The interposer substrate 120 may include upper conductive patterns 124 disposed on the top surface 120a thereof and lower conductive patterns 126 disposed on the bottom surface thereof. For example, the upper conductive patterns 124 and the lower conductive patterns 126 may include a conductive pattern that is formed by a solder bump or metal such as copper. A portion of the upper and lower conductive patterns 124 and 126 may serve as solder ball lands on which a solder ball is disposed, wirings, or wire pads. The interposer substrate 120 may include a plurality of through-vias 122 that are electrically connected to the upper and lower conductive patterns 124 and 126. For example, the interposer substrate 120 may include a through-silicon via (TSV) or a through-glass via (TGV). Inner wirings (not shown) connecting the through-vias 122 to each other may be disposed between the through-vias 122.

Semiconductor devices may be disposed on the top surface 120a of the interposer substrate 120. The semiconductor devices may include a transmitter 140a and a receiver 140b. The transmitter 140a and the receiver 140b may be mounted on the top surface 120a of the interposer substrate 120 by a wire bonding. For example, the transmitter 140a and the receiver 140b may be bonded to the top surface 120a of the interposer substrate 120 by using an adhesive member ADH, and electrically connected to the upper conductive patterns 124 of the interposer substrate 120 by a wire bonding. Here, the transmitter 140a and the receiver 140b may be spaced apart from each other.

Meanwhile, although two semiconductor devices (e.g., the transmitter 140a and the receiver 140b) are mounted on the interposer substrate 120 in FIGS. 1 and 2, more than two semiconductor devices may be mounted. That is, as necessary, the semiconductor devices may further include a device, e.g., a separator for separating transmission/reception signals, in addition to the transmitter 140a and the receiver 140b.

An exothermic element 130 may be disposed on the bottom surface 120b of the interposer substrate 120. For example, the exothermic element 130 may be directly mounted on the bottom surface 120b of the interposer substrate 120 by external terminals 132, in a flip chip (F/C) method. The external terminals 132 may be solder bumps. Through the external terminals, the exothermic element 130 may be electrically connected to the lower conductive patterns 126 of the interposer substrate 120. Here, the exothermic element 130 may be electrically connected to the transmitter 142a through the through-vias 122 and/or inner wirings (not shown) of the interposer substrate 120. The exothermic element 130 may include a device generating high temperature heat, such as a signal amplifier. For example, the signal amplifier may be used to amplify a transmission signal.

A heat dissipation member 110 may be disposed on the bottom surface 120b of the interposer substrate 120. The heat dissipation member 110 may have a shape for covering the exothermic element 130. For example, the heat dissipation member 110 may include a recessed region R in an upper portion thereof to completely cover side and bottom surfaces of the exothermic element 130. The exothermic element 130 may be disposed in the recessed region R of the heat dissipation member 110. Accordingly, the recessed region R of the heat dissipation member 110 may has a size greater than that of the exothermic element 130. The heat dissipation member 110 may be attached to the bottom surface 120b of the interposer substrate 120 and the exothermic element 130 by using the adhesive member ADH. For example, the adhesive member ADH may include a thermal conductive adhesive to efficiently discharge heat. The heat dissipation member 110 may distribute and discharge heat generated from the exothermic element 130.

A ground substrate 150 may be disposed on the interposer substrate 120. The ground substrate 150 may serve as a ground (an earth) of the transmitter 140a and the receiver 140b. As necessary, the ground substrate 150 may serve as an antenna of the transmitter/receiver package 10. Meanwhile, according to another embodiment, an antenna part (not shown) may be separately disposed on the ground substrate 150.

Connection members may be disposed between the interposer substrate 120 and the ground substrate 150. For example, the connection members may include a first connection member 162 disposed on one side of the interposer substrate 120 and a second connection member 164 disposed on the other side opposed to the one side. The first connection member 162 and the second connection member 164 may provide a cavity C between the interposer substrate 120 and the ground substrate 150. The cavity C provided by the first connection member 162 and the second connection member 164 may provide a space for disposing the transmitter 140a and the receiver 140b. The first connection member 162 and the second connection member 164 may include through-vias 166. The through-vias 166 of the first and the second connection members 162 and 164 may electrically connect the interposer substrate 120 to the ground substrate 150. For example, the first connection member 162 and the second connection member 164 may include a through-silicon via (TSV) or a through-glass via (TGV).

In case of a typical transmitter/receiver package, generally, two interposer substrates are vertically stacked, and semiconductor devices and an exothermic element are mounted on each of the interposer substrates. In this case, spatial efficiency decreases, and a manufacturing process has a difficulty in accurately aligning each of the interposer substrates to each of terminals in a flip chip bonding method. According to embodiments of the inventive concept, the transmitter/receiver package may mount all of the semiconductor devices and the exothermic element on one interposer substrate to realize the transmitter/receiver package, thereby improving process efficiency. Also, according to an embodiment of the inventive concept, the integration and lightening of components may be realized, and the number of the interposer substrate decreases to improve endurance to mechanical deformation.

Hereinafter, a method for manufacturing the transmitter/receiver package according to an embodiment of the inventive concept will be described with reference to the accompanying drawings.

Figure 3:
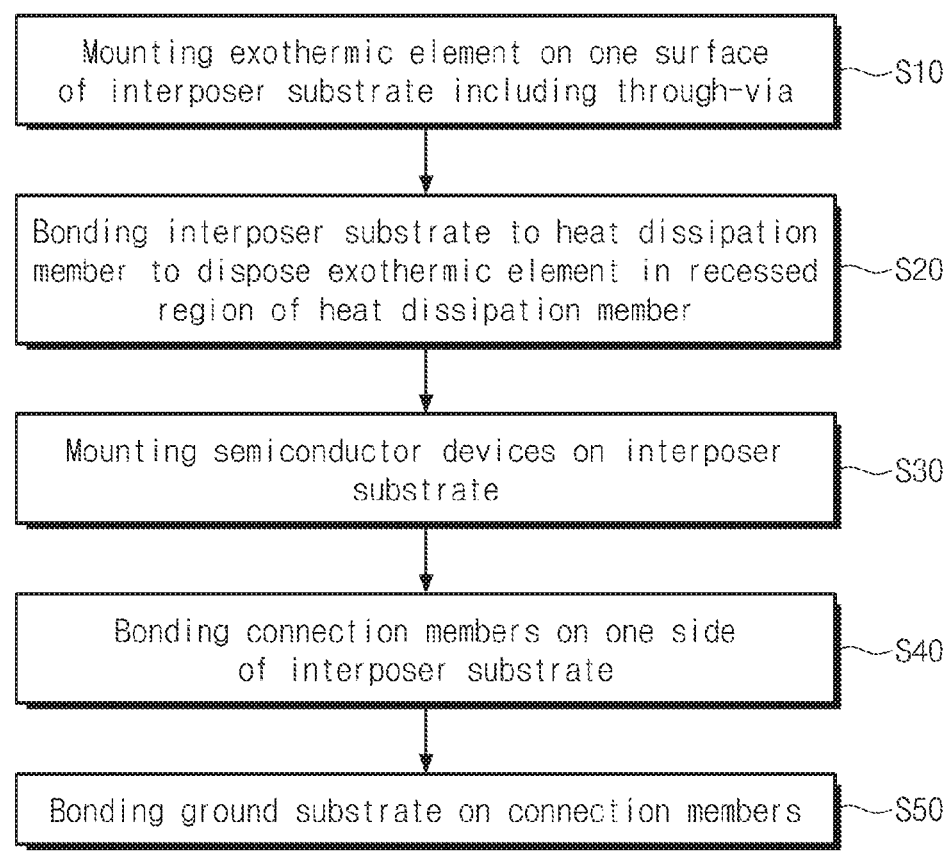
FIG. 3 is a flowchart for explaining a method for manufacturing the transmitter/receiver package according to an embodiment of the inventive concept.

FIG. 3 is a flowchart for explaining a method for manufacturing the transmitter/receiver package according to an embodiment of the present disclosure. Referring to FIG. 3, according to an embodiment of the inventive concept, the method for manufacturing the transmitter/receiver package may include mounting the exothermic element on a surface of the interposer substrate including the through-vias (S10), bonding the interposer substrate to the heat dissipation member to dispose the exothermic element in the recessed region of the heat dissipation member (S20), mounting the semiconductor devices on the interposer substrate (S30), bonding the connection members to one side of the interposer substrate (S40), and bonding the ground substrate on the connection members (S50).

FIGS. 4A to 4G are cross-sectional views for explaining a method for manufacturing the transmitter/receiver package according to an embodiment of the inventive concept.

Referring to FIGS. 3, 4A, and 4B, the exothermic element 130 may be mounted on one surface of the interposer substrate 120 including the through-vias (S10). Briefly, the exothermic element 130 may be disposed on one surface of the interposer substrate 120 through the flip chip bonding method. Here, the one surface of the interposer substrate 120 in which the exothermic element 130 is mounted may be the bottom surface 120b of the interposer substrate 120 in the transmitter/receiver package 10. Here, a position of the interposer substrate 120 in which the exothermic element 130 is mounted is designed such that the exothermic element 130 can be disposed in the recessed region R of the heat dissipation member 110. In detail, the mounting of the exothermic element 130 on one surface of the interposer substrate 120 through the flip chip bonding method may be performed by applying under fill (not shown) on the bottom surface 120b of the interposer substrate 120, and then, attaching the exothermic element 130 thereto. For example, the under fill (not shown) may be applied to one area of the bottom surface 120b of the interposer substrate 120. Here, one area to which the under fill (not shown) is applied may be an area on the lower conductive patterns 126 of the interposer substrate 120. The lower conductive patterns 126 of the interposer substrate 120 may be arranged to correspond to the external terminals 132 of the exothermic element 130, and then, the exothermic element 130 may be bonded on the bottom surface 120b of the interposer substrate 120. The application of the under fill (not shown) may be performed to easily connect the external terminals 132 of the exothermic element 130 to the lower conductive patterns 126 of the interposer substrate 120. As necessary, the under fill process may be omitted to further simplify the manufacturing process.

Figure 4C:
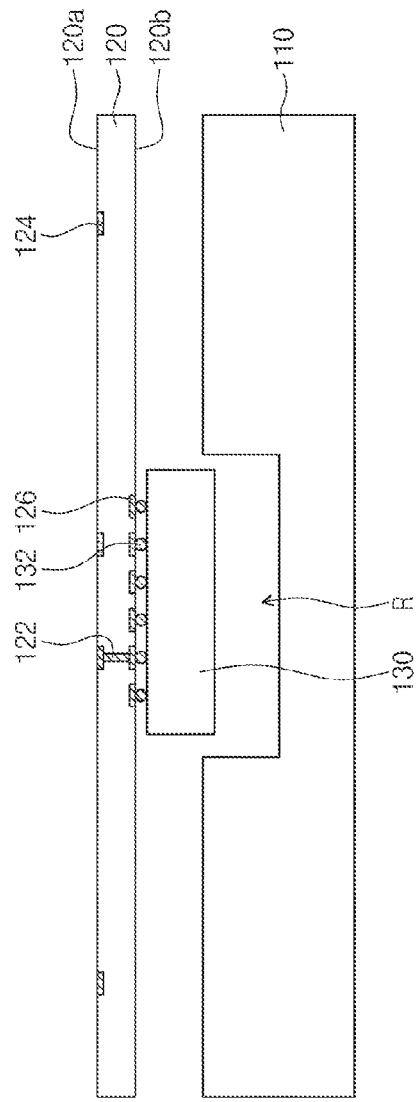
Figure 4D:
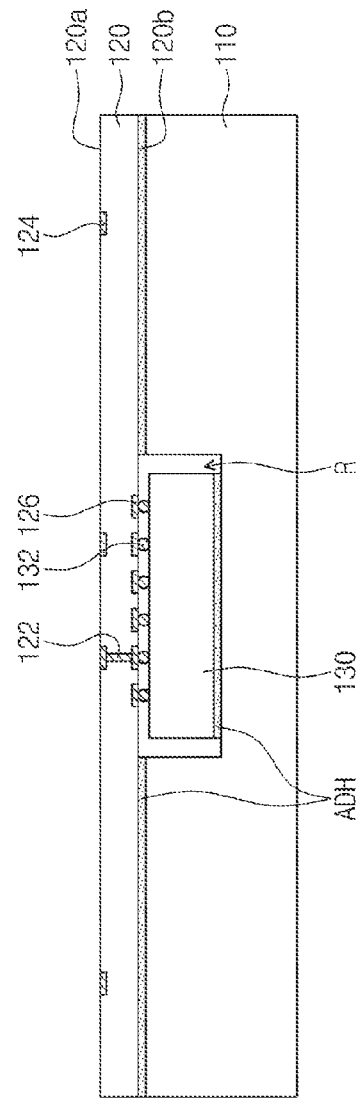

Referring to FIGS. 3, 4C, and 4D, the interposer substrate 120 may be bonded onto the heat dissipation member 110 (S20). Here, the recessed region R is disposed on the upper portion of the heat dissipation member 110. The interposer substrate 120 may be bonded to the heat dissipation member 110 so that the exothermic element 130 mounted on one surface of the interposer substrate 120 is disposed in the recessed region R of the heat dissipation member 110. For example, the exothermic element 130 and the recessed region R of the heat dissipation member 110, and the interposer substrate 120 and the heat dissipation member 110 may be attached to each other using the adhesive member ADH.

Figure 4E:
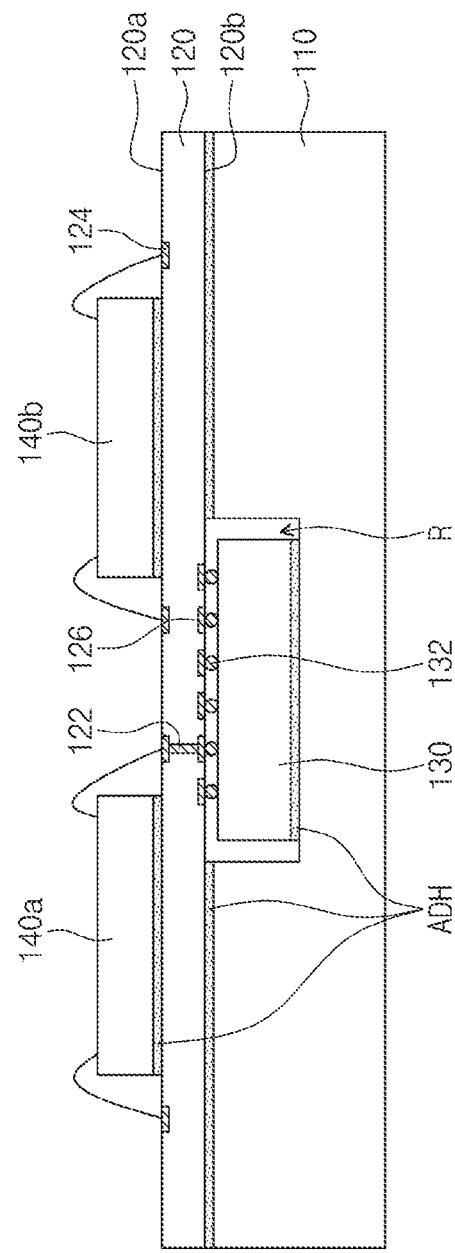

Referring to FIGS. 3 and 4E, the transmitter 140a and the receiver 140b may be mounted on the interposer substrate 120 (S30). The transmitter 140a and the receiver 140b may be spaced apart from each other on the top surface 120a of the interposer substrate 120. The transmitter 140a and the receiver 140b may be mounted on the top surface 120a of the interposer substrate 120 through a wire bonding manner. For example, the transmitter 140a and the receiver 140b may be attached to the top surface 120a of the interposer substrate 120 by using the adhesive member ADH. Then, the transmitter 140a and the receiver 140b may be electrically connected to the upper conductive patterns 124 of the interposer substrate 120 through a bonding wire.

Figure 4F:
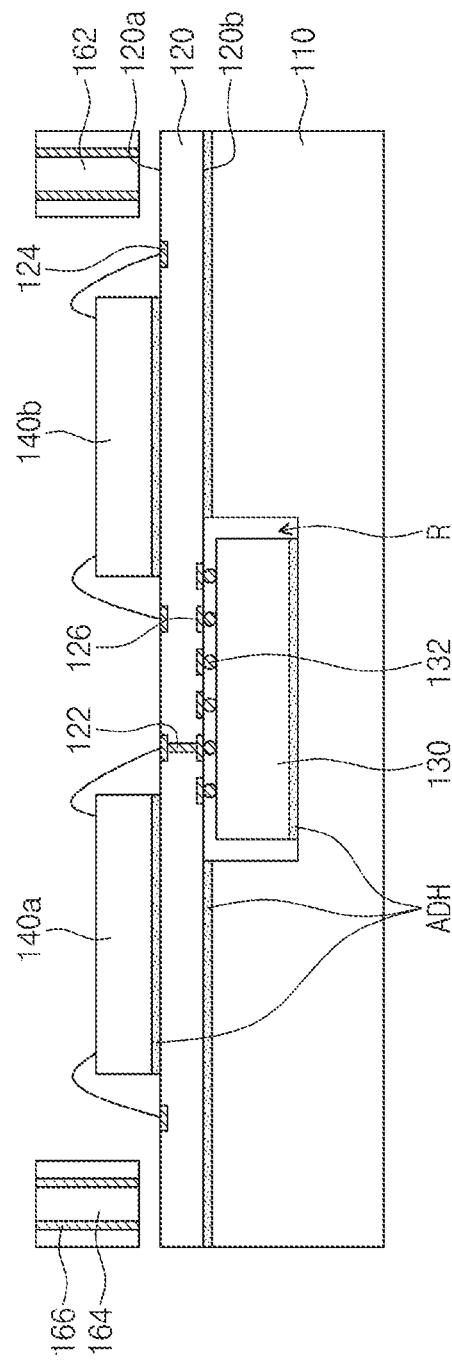

Referring to FIGS. 3 and 4F, the connection members may be bonded on the interposer substrate 120 (S40). For example, the first connection member 162 may be bonded to one side of the interposer substrate 120, and the second connection member 164 may be bonded to the other side opposed to the one side. Here, the first and the second connection members 162 and 164 may include the through-vias 166, and the through-vias 166 of the first and the second connection members 162 and 164 may be electrically connected to the interposer substrate 120. For example, inner wirings (not shown) of the interposer substrate 120 may be arranged to correspond to the through-vias 166 of the first and the second connection members 162 and 164, and then, the first and the second connection members 162 and 164 may be bonded to the interposer substrate 120.

Referring to FIGS. 3 and 4G, the ground substrate 150 may be bonded to the connection members (S50). For example, the ground substrate 150 may be bonded so that a top surface of the first spacer 162 contacts a top surface of the second connection member 164. Here, the ground substrate 150 may be mounted to be connected to the through-vias 166 of the first and the second connection members 162 and 164. For example, the through-vias 166 of the first and the second connection members 162 and 164 may be aligned to correspond to the ground substrate 150, and then, the ground substrate 150 may be bonded to the first and the second connection members 162 and 164.

According to the present embodiment of the inventive concept, the transmitter/receiver package may use only one interposer substrate to realize the simplification and downsizing of the structure thereof.

According to the present embodiment of the inventive concept, the transmitter/receiver package may use only one interposer substrate to realize the simplification and downsizing of the structure thereof. Accordingly, in the flip chip bonding process among the manufacturing process, the arrangement between the interposer substrate and the spacer may be easy, and the yield of the manufacturing process may increase.

The description of the present disclosure is intended to be illustrative, and those with ordinary skill in the technical field of the present disclosure will be understood that the present disclosure can be carried out in other specific forms without changing the technical idea or essential features. Thus, the above-disclosed embodiments are to be considered illustrative and not restrictive.

What is claimed is:

1. A transmitter and receiver package comprising:
    an interposer substrate comprising a top surface, a bottom surface facing the top surface, and a through-via;
    semiconductor devices mounted on the top surface of the interposer substrate, the semiconductor devices comprising a transmitter and a receiver, which are disposed to be spaced apart from each other;
    an exothermic element mounted on the bottom surface of the interposer substrate; and
    a heat dissipation member disposed on the bottom surface of the interposer substrate, the heat dissipation member being configured to cover the exothermic element,
    wherein the transmitter and the exothermic element are electrically connected to each other, through the interposer substrate.

2. The transmitter and receiver package of claim 1, wherein the exothermic element is mounted on the bottom surface of the interposer substrate in a flip chip manner.

3. The transmitter and receiver package of claim 1, wherein the exothermic element is electrically connected to the transmitter through the through-vias.

4. The transmitter and receiver package of claim 1, wherein the exothermic element is in contact with the heat dissipation member to discharge heat to the heat dissipation member.

5. The transmitter and receiver package of claim 4, wherein the interposer substrate and the exothermic element, and the interposer substrate and the heat dissipation member are attached to each other by using a thermal conductive adhesive provided therebetween.

6. The transmitter and receiver package of claim 1, wherein the exothermic element comprises a signal amplifier.

7. The transmitter and receiver package of claim 1, wherein the transmitter and the receiver are mounted on the top surface of the interposer substrate in a wire bonding manner.

8. The transmitter and receiver package of claim 1, wherein the semiconductor devices further comprises a separator for separating a transmission signal from a reception signal.

9. The transmitter and receiver package of claim 1, wherein the through-via of the interposer substrate comprises a through-silicon via (TSV) or a through-glass via (TGV).

10. The transmitter and receiver package of claim 1, further comprising:
    a ground substrate disposed on the interposer substrate; and
    connection members configured to provide a cavity, in which the semiconductor devices are disposed, between the interposer substrate and the ground substrate,
    wherein each of the connection members comprises:
    a first connection members disposed on one side of the interposer substrate; and
    a second connection members disposed on the other side facing the one side.

11. The transmitter and receiver package of claim 10, wherein the connection members comprises the through-via.

12. The transmitter and receiver package of claim 10, wherein the ground substrate is electrically connected to the interposer substrate through the through-via of the connection members.

13. The transmitter and receiver package of claim 10, the ground substrate is used as an antenna.

* * * * *